(12) United States Patent
Abbasi Gavarti et al.

(10) Patent No.: US 10,737,929 B2
(45) Date of Patent: Aug. 11, 2020

(54) TRENCH-BASED MICROELECTROMECHANICAL TRANSDUCER AND METHOD FOR MANUFACTURING THE MICROELECTROMECHANICAL TRANSDUCER

(71) Applicant: STMICROELECTRONIC S.r.l., Agrate Brianza (IT)

(72) Inventors: Mohammad Abbasi Gavarti, Milan (IT); Daniele Caltabiano, Agrate Brianza (IT); Anna Angela Pomarico, San Cesario Lecce (IT); Giuditta Roselli, Lecce (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 15/962,952

(22) Filed: Apr. 25, 2018

(65) Prior Publication Data
US 2018/0312393 A1 Nov. 1, 2018

(30) Foreign Application Priority Data
Apr. 26, 2017 (IT) .................. 102017000045285

(51) Int. Cl.
*B81B 3/00* (2006.01)
*H01L 41/113* (2006.01)
(Continued)

(52) U.S. Cl.
CPC ........ *B81B 3/0021* (2013.01); *B81C 1/00269* (2013.01); *G01L 9/0042* (2013.01);
(Continued)

(58) Field of Classification Search
CPC ............ H01L 41/1132; H01L 41/1134; G01L 9/0042; G01L 9/0052; G01L 9/0054; G01L 9/0055; B81C 1/00269; B81B 3/0021
See application file for complete search history.

(56) References Cited

U.S. PATENT DOCUMENTS

| 5,773,728 A | 6/1998 | Tsukada et al. |
| 8,636,461 B2 | 1/2014 | Hammonds |

(Continued)

FOREIGN PATENT DOCUMENTS

| CN | 202974521 U | 6/2013 |
| CN | 103398807 A | 11/2013 |

(Continued)

OTHER PUBLICATIONS

Baumann et al., "CMOS-Based High-Pressure Sensor Using Surface Trenches for Sensitivity Enhancement," *IEEE Sensors 2010 Conference*, Waikoloa Hawaii, USA, Nov. 1-4, 2010, pp. 2644-2647.

(Continued)

*Primary Examiner* — Earl N Taylor
(74) *Attorney, Agent, or Firm* — Seed IP Law Group LLP

(57) ABSTRACT

A microelectromechanical transducer includes: a semiconductor body, having a first surface and a second surface opposite to one another; a first structural body, coupled to the first surface of the semiconductor body; a first sealed cavity between the semiconductor body and the first structural body; and an active area housed in the first sealed cavity, including at least two trenches and a sensor element between the trenches. The trenches extend along a vertical direction from the first surface towards the second surface of the semiconductor body.

20 Claims, 11 Drawing Sheets

(51) Int. Cl.
  *B81C 1/00* (2006.01)
  *G01L 9/00* (2006.01)
(52) U.S. Cl.
  CPC .. *H01L 41/1132* (2013.01); *B81B 2201/0264* (2013.01); *B81B 2203/0109* (2013.01); *B81B 2207/07* (2013.01); *B81B 2207/093* (2013.01); *B81C 2203/0109* (2013.01)

(56) References Cited

U.S. PATENT DOCUMENTS

| | | | |
|---|---|---|---|
| 9,676,614 B2 * | 6/2017 | Johari-Galle | B81C 1/00134 |
| 9,804,047 B2 * | 10/2017 | Pagani | G01L 9/0052 |
| 10,167,189 B2 * | 1/2019 | Zhang | B81B 7/0048 |
| 2007/0113658 A1 * | 5/2007 | Combi | G01L 9/0025 73/702 |
| 2009/0154734 A1 * | 6/2009 | Jeong | H04R 19/005 381/173 |
| 2011/0146411 A1 * | 6/2011 | Doering | G01L 9/0054 73/727 |
| 2011/0239784 A1 | 10/2011 | Ohsato | |
| 2012/0042731 A1 | 2/2012 | Lin et al. | |
| 2013/0199301 A1 * | 8/2013 | Kautzsch | B81C 1/00158 73/754 |
| 2016/0282206 A1 | 9/2016 | Baumann | |
| 2016/0349129 A1 * | 12/2016 | Pagani | G01L 9/0052 |
| 2016/0370242 A1 * | 12/2016 | Duqi | G01L 9/0054 |
| 2018/0074090 A1 * | 3/2018 | Boysel | G01C 19/5762 |
| 2018/0238753 A1 * | 8/2018 | Abbasi Gavarti | G01L 9/0002 |
| 2018/0275000 A1 * | 9/2018 | Chau | G01L 9/04 |
| 2018/0306656 A1 * | 10/2018 | Guidetti | G01M 5/0041 |
| 2018/0312393 A1 * | 11/2018 | Abbasi Gavarti | B81B 3/0021 |
| 2018/0372564 A1 * | 12/2018 | Abbasi Gavarti | G01L 1/18 |

FOREIGN PATENT DOCUMENTS

| | | | |
|---|---|---|---|
| CN | 103575446 A | 2/2014 | |
| CN | 205826188 U | 12/2016 | |
| CN | 208847373 U | 5/2019 | |
| EP | 2423157 A2 * | 2/2012 | B81C 1/00309 |
| EP | 3396344 A1 * | 10/2018 | B81B 3/0021 |
| WO | 2013/192539 A1 | 12/2013 | |

OTHER PUBLICATIONS

Baumann et al., "Modeling and Characterization of a CMOS Sensor with Surface Trenches for High-Pressure Applications," *MEMS 2011*, IEEE, Cancun, Mexico, Jan. 23-27, 2011, pp. 601-604.

Hwang et al., "A Polymer-Based Flexible Tactile Sensor for Both Normal and Shear Load Detections and Its Application for Robotics," *Journal of Microelectromechanical Systems* 16(3):556-563, 2007.

U.S. Appl. No. 15/957,819, filed Apr. 19, 2018, Stress Sensor for Monitoring the Health State of Fabricated Structures Such as Constructions, Buildings, Infrastructures and the Like.

\* cited by examiner

TRENCH-BASED MICROELECTROMECHANICAL TRANSDUCER AND METHOD FOR MANUFACTURING THE MICROELECTROMECHANICAL TRANSDUCER

BACKGROUND

Technical Field

The present disclosure relates to a microelectromechanical transducer and to a method for manufacturing the microelectromechanical transducer. In particular, the present disclosure relates to a trench-based solid-body pressure or force sensor and to a manufacturing method thereof.

Description of the Related Art

As is known, integrated pressure sensors can be manufactured with micromachining techniques. These sensors typically comprise a thin membrane, or diaphragm, suspended over a cavity provided in a silicon body. Formed within the membrane are piezoresistive elements connected together to form a Wheatstone bridge. When subjected to a pressure, the membrane undergoes deformation, causing a variation of resistance of the piezoresistive elements, and thus an unbalancing of the Wheatstone bridge. As an alternative, capacitive sensors are available, where the membrane provides a first plate of a capacitor, whereas a second plate is provided by a fixed reference. During use, deflection of the membrane generates a variation of the capacitance of the capacitor, which may be detected and associated to the pressure exerted on the membrane.

However, these semiconductor sensors may not in themselves be used for measuring high pressures in so far as they typically have low full-scale values. Thus, for high-pressure applications, piezoresistors are formed at a surface of a N-type silicon body, e.g., by means of P+ implants.

Examples of manufacturing techniques and applications are provided in U.S. Pat. No. 5,773,728. According to the disclosure of U.S. Pat. No. 5,773,728, a semiconductor sensor suitable for high-pressure applications includes piezoresistors on top of strain gauges directly connected to the surface of a silicon substrate. The active region, consisting of (i) the strain gauges, (ii) the trenches between them and (iii) the piezoresistors, is exposed to the environment. The absence of a protection structure induces risks of damage or leakage on said active region, preventing a reliable use of the sensor in harsh environments.

It is known to the present applicant that a gel may be used to protect the active region. However, the protective gel could be damaged or removed in conditions of high temperature and/or high pressure, or when in contact with specific fluids for hydrostatic pressure applications. Moreover, said protective gel would fill trenches in active regions, affecting their behavior.

BRIEF SUMMARY

One or more embodiments of the present disclosure provide a microelectromechanical transducer and a method for manufacturing the microelectromechanical transducer to overcome the problems previously illustrated. In particular, one or more embodiments of the present disclosure provide an alternative solution for protecting the active region of a piezoresistive pressure sensor, which overcomes the above stated disadvantages.

According to the present disclosure, a microelectromechanical transducer and a method for manufacturing the microelectromechanical transducer are provided.

One or more embodiments of the present disclosure relate to a new solid state piezo-resistive force/pressure sensor exploiting 1) trenches in order to have the desired stress distribution and 2) an excavated cap which remove the vertical load component, enhance the in-plane stress components and protect the sensitive part. This is a very effective way to make a robust sensor for a wide range of applications. Moreover, the sensor measure does not measure the deflection of any membrane or flexible diaphragm.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
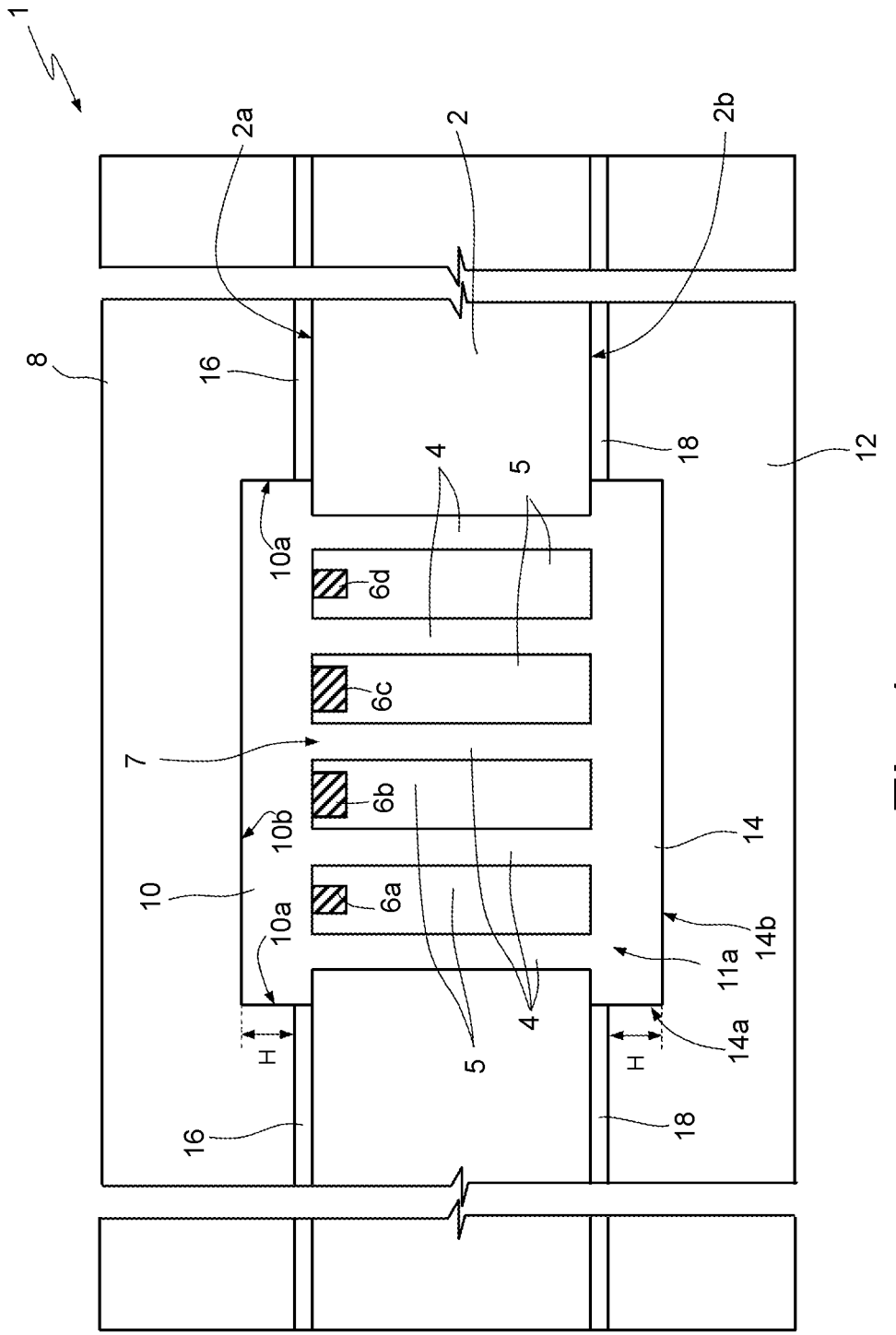
FIG. 1 is a cross-section view of a microelectromechanical transducer according to an embodiment of the present disclosure.

FIG. 1 shows a cross-section view of a microelectromechanical transducer, in particular a pressure sensor, 1 according to an embodiment of the present disclosure. The pressure sensor 1 in FIG. 1 is represented in a system of spatial coordinates x, y, z, and the cross-section view is taken along the line I-I shown in FIG. 2. The pressure sensor 1 comprises a sensor body 2 having a front surface 2a and rear surface 2b. A plurality of trenches 4 extends throughout the sensor body 2 from the front surface 2a to the rear surface 2b, and in particular in parallel with the z-axis. The trenches 4 define opposite sides of bridge structures 5 of the sensor body 2.

Piezoresistors 6a-6d are arranged respectively arranged in the bridge structures 5 at the front surface 2a and in between the trenches 4; in particular, between a pair of adjacent trenches 4 is arranged a single piezoresistor 6a; ...; 6d. The trenches 4, bridge structures 5, and the piezoresistors 6a-6d define an active region 7 of the pressure sensor 1.

According to one aspect of the present disclosure, the sensor body 2 is of a semiconductor material and in particular silicon; more specifically, the sensor body 2 is made of n-type single-crystal silicon and the piezoresistors 6a-6d are p+ implanted regions.

A first structural body 8 having the function of a cap is coupled to the front surface 2a of the sensor body 2 through a first coupling region 16. In the following, the first structural body 8 is referenced as cap. The cap 8 has a recess 10 facing the front surface 2a in correspondence of the active region 7. The recess 10 is delimited by lateral walls 10a of height H, and a bottom wall 10b. Exemplary values of the height H of the lateral walls 10a are in the range of 1-500 μm. The lateral walls 10a and the bottom wall 10b are arranged at an angle α. The lateral walls 10a surround the active region 7 and the bottom wall extends at a distance from the front surface 2a of the sensor body 2. In this way, the recess 10 of the cap 8 is part of a sealed cavity 11a, wherein the active region 7 is housed. The cavity 11a is sealed by means of the first coupling region 16, made for instance of glass, metal bonding like Al/Ge or Au/Ge alloys, bi-adhesive layers, in general wafer bonding materials; the first coupling region 16 may be formed by wafer-to-wafer bonding techniques (e.g., glass frit).

A second structural body 12 having the function of a supporting substrate is coupled to the rear surface 2b of the sensor body 2 through a second coupling region 18. In the following, the second structural body 12 is referenced as substrate. The substrate 12 has a recess 14 facing the rear surface 2b in correspondence of the area in which the trenches 7 extend. The recess 14 is delimited by lateral walls 14a and a bottom wall 14b. The lateral walls 14a surround the trenches 4 and the bottom wall extends at a distance from the rear surface 2b of the sensor body 2. In this way, the recess 14 of the substrate 12 is part of the sealed cavity 11a, which also includes the trenches 4 between the bridge structures 5. In particular, according to one aspect of this embodiment, the recesses 14 and 10 are at least partially aligned along the z-axis. In particular, the recesses 14 and 10 are overlapping, as it can be seen from a top view on the xy-plane.

The recess 14 is sealed by means of the second coupling region 18, made for instance of glass, metal bonding materials like Al/Ge alloys or bi-adhesive layers. Analogously to the first coupling region 16, the second coupling region 18 may be formed by wafer-to-wafer bonding techniques (e.g., glass frit).

The cap 8 and the substrate 12 may be of any suitable material, such as semiconductor materials, ceramics, steel or metallic alloys (e.g., Invar, Kovar).

Figure 2:
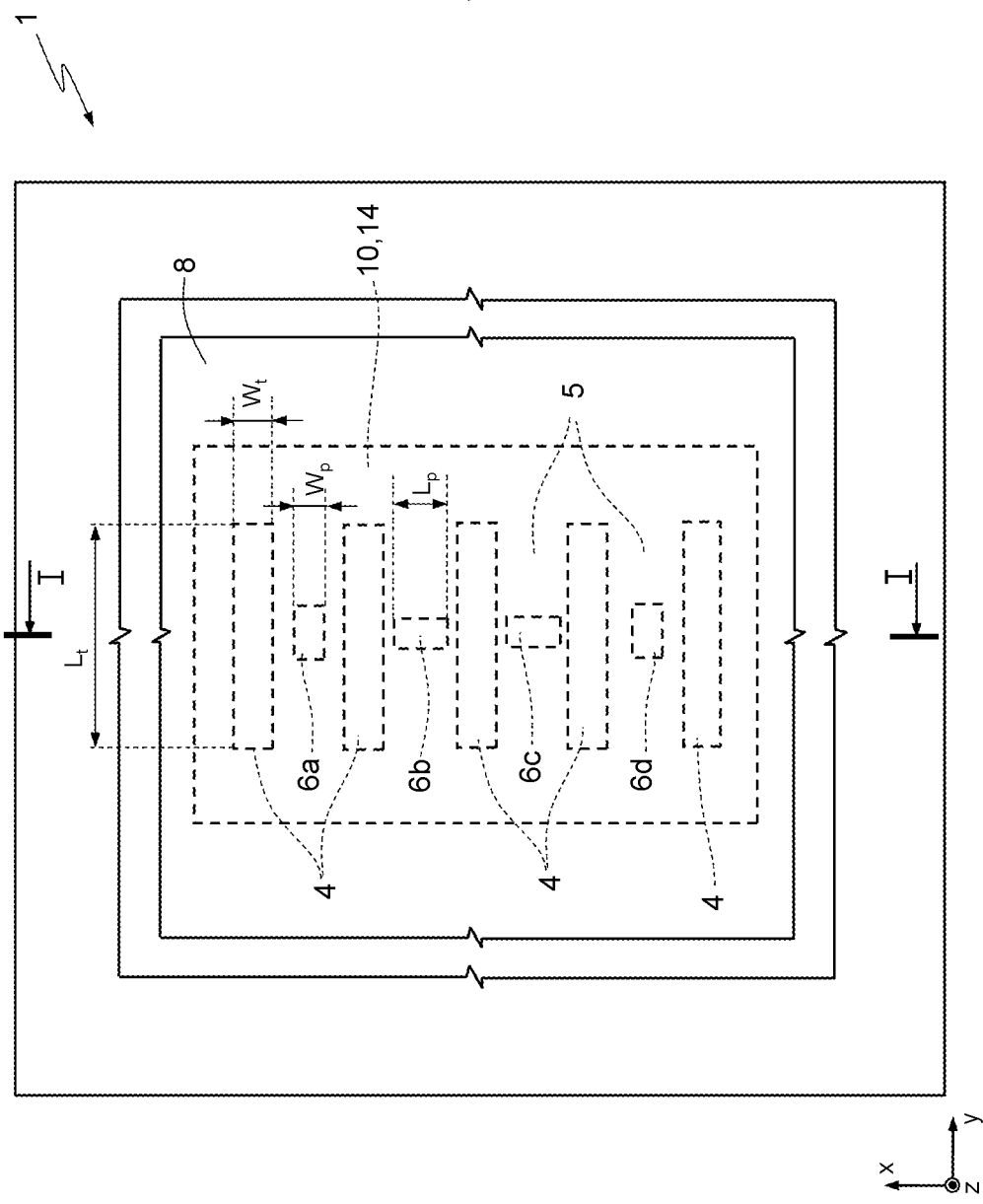
FIG. 2 is a top view of the microelectromechanical transducer of FIG. 1.
Figure 3:
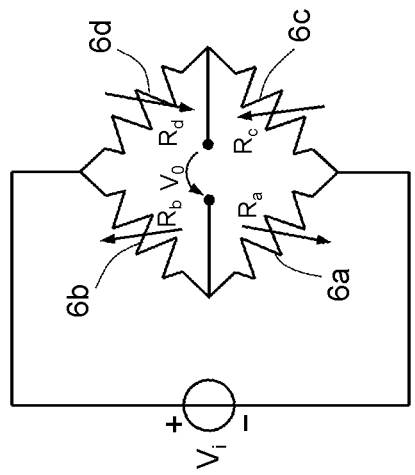
FIG. 3 is a circuit representation of a Wheatstone bridge employed as read-out circuit of the microelectromechanical transducer of FIG. 1.

FIG. 2 shows a top view on the xy-plane of the pressure sensor 1 of FIG. 1. From this view, the trenches 4 have a substantially rectangular shape, for instance with rounded corners. Longer sides of the rectangles define the length $L_t$ of the trenches 4, whereas the shorter sides define the width $W_t$ of the trenches 4. Exemplary values of the dimensions of the trenches 4 are in the range of 10-1000 μm for the length $L_t$, and in the range of 1-500 μm for the width $W_t$. The piezoresistors 6a-6d have a substantially rectangular or oval or elliptical shape, with a major axis defining a length $L_p$ of the piezoresistors 6a-6d and a minor axis defining a width $W_p$ of the piezoresistors 6a-6d. Exemplary values of the dimensions of the piezoresistors 6a-6d are in the range of 5-100 μm for the length $L_p$, and in the range of 1-50 μm for the width $W_p$. Trenches 4 are aligned to one another along their length, in parallel to the y-axis. Piezoresistors 6a-6d may be arranged in such a way that their length $L_p$ is parallel or perpendicular to the length $L_t$ of the trenches 4. In this embodiment, four piezoresistors 6a-6d are electrically connected in a Wheatstone bridge configuration, as schematically shown in FIG. 3. To achieve a proper functioning of the Wheatstone bridge (as detailed in the following), two piezoresistors 6a, 6d, are arranged in such a way that their length $L_p$ is parallel to the length $L_t$ of the trenches 4, whereas the other two piezoresistors 6b, 6c, are arranged in such a way that their length $L_p$ is perpendicular to the length $L_t$ of the trenches 4.

An exemplary method of manufacturing of pressure sensor 1 is described in the following. First, an n-type single-crystal silicon wafer comprising the sensor body 2 is provided. A first photoresist mask is formed on top of the front surface 2a, by standard optical lithography techniques. Openings in the photoresist mask correspond to the regions where the piezoresistors 6a-6d should be formed. The piezoresistors 6a-6d may be formed by implantation or diffusion of p-type dopant elements, for instance boron. The techniques to form the piezoresistors 6a-6d, as well as their connection in a Wheatstone bridge, are known and thus they will not be described in further detail. After removing the first photoresist mask, a second photoresist mask is formed on top of the front surface 2a. The openings in the second photoresist mask correspond to the areas in which the trenches 4 should be formed, at a distance from the areas in which the piezoresistors 6a-6d were formed. Using the second photoresist mask, the sensor body 2 is etched selectively through its whole thickness, until openings at the rear surface 2b are formed. The etching step to form the trenches 4 is a standard bulk micromachining technique and it may be of a wet or dry type. The second photoresist mask is then removed.

A second wafer of silicon or any other suitable material is provided, comprising the cap 8. A third photoresist mask is formed on the front side of the second wafer by standard optical lithography techniques. The openings on the third photoresist mask correspond to the position of the cavity 10. The area of the openings on the third photoresist mask should be defined in such a way that it includes the area of the openings of both the first and the second photoresist mask when they are aligned to one another. Using the third photoresist mask, the cap 8 is etched selectively up to a depth lower than its thickness. Then, the third photoresist mask is removed.

A third wafer of silicon or any other suitable material is provided, comprising the substrate 12. A fourth photoresist mask is formed on the front side of the third wafer by standard optical lithography techniques. The openings on the fourth photoresist mask correspond to the position of the cavity 14. The area of the openings on the fourth photoresist mask should be defined in such a way that it includes the area of the openings of both the first and the second photoresist mask when they are aligned to one another. Using the fourth photoresist mask, the substrate 12 is etched selectively up to a depth lower than its thickness. Then, the fourth photoresist mask is removed.

Next, the first wafer, comprising the sensor body 2, and the second wafer, comprising the cap 8, are coupled to one another at the surface 2a through the coupling region 16, obtained by known wafer-to-wafer bonding techniques, for instance glass frit.

Next, the first wafer, comprising the sensor body 2, and the third wafer, comprising the substrate 12, are coupled to one another at the surface 2b through the coupling region 18, obtained by known wafer-to-wafer bonding techniques, for instance glass frit.

In this way, the cavities 10 and 14 are sealed and the active region 7 is not exposed to the environment.

Figure 4:
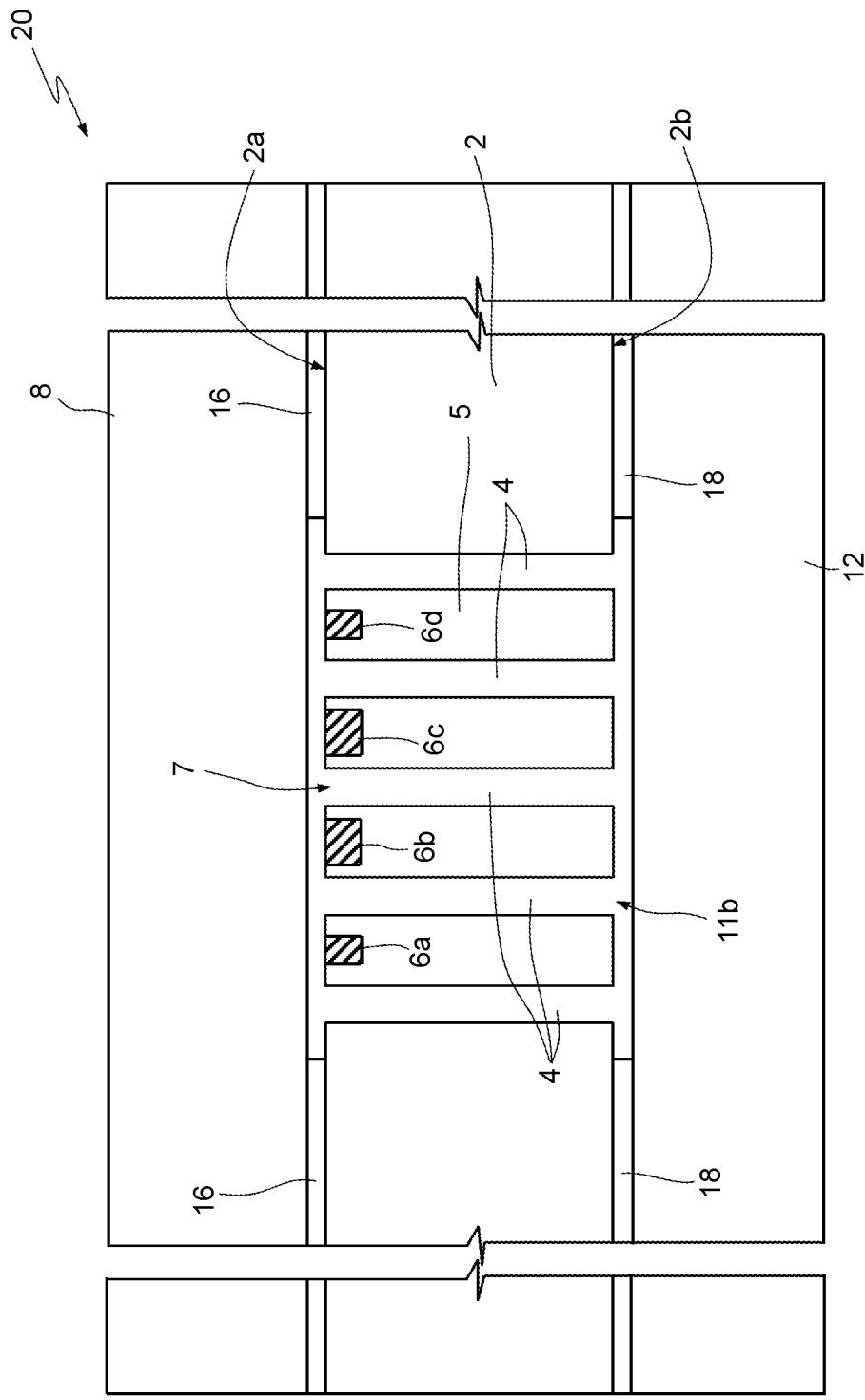
FIG. 4 is a cross-section view of a microelectromechanical transducer according to another embodiment of the present disclosure.

FIG. 4 shows a pressure sensor 20 according to a further embodiment of the present disclosure. Differently from the pressure sensor 1 illustrated in FIG. 1, the recesses 10 and 14 are not present. All other elements are in common to the pressure sensor 1 of FIG. 1 and designated by the same reference numbers, thus they are not described any further. As in the case of pressure sensor 1 of FIG. 1, the cap 8 and the substrate 12 are at a distance from the front surface 2a and rear surface 2b, respectively, by means of the coupling regions 16 and 18. As a result, a cavity 11b is formed, which includes the trenches 4, the open area between the top surface 2a of the sensor body 2 and a bottom surface of the cap 8, and the open area between the bottom surface 2b of the sensor body 2 and a top surface of the substrate 12. The pressure sensor 20 of FIG. 4 is easier to be manufactured than the pressure sensor 1 of FIG. 1 because it does not include the etching steps of the cap 8 and the substrate 12 to form the recesses 10 and 14.

During use of the pressure sensors 1, 20, a pressure or force applied along the z-axis may cause the cap 8 and the substrate 12 to bend. To ensure protection and a proper functioning of the active region 7, neither the cap 8 nor the substrate 12 should come into direct contact with the sensor body 2.

Figure 5:
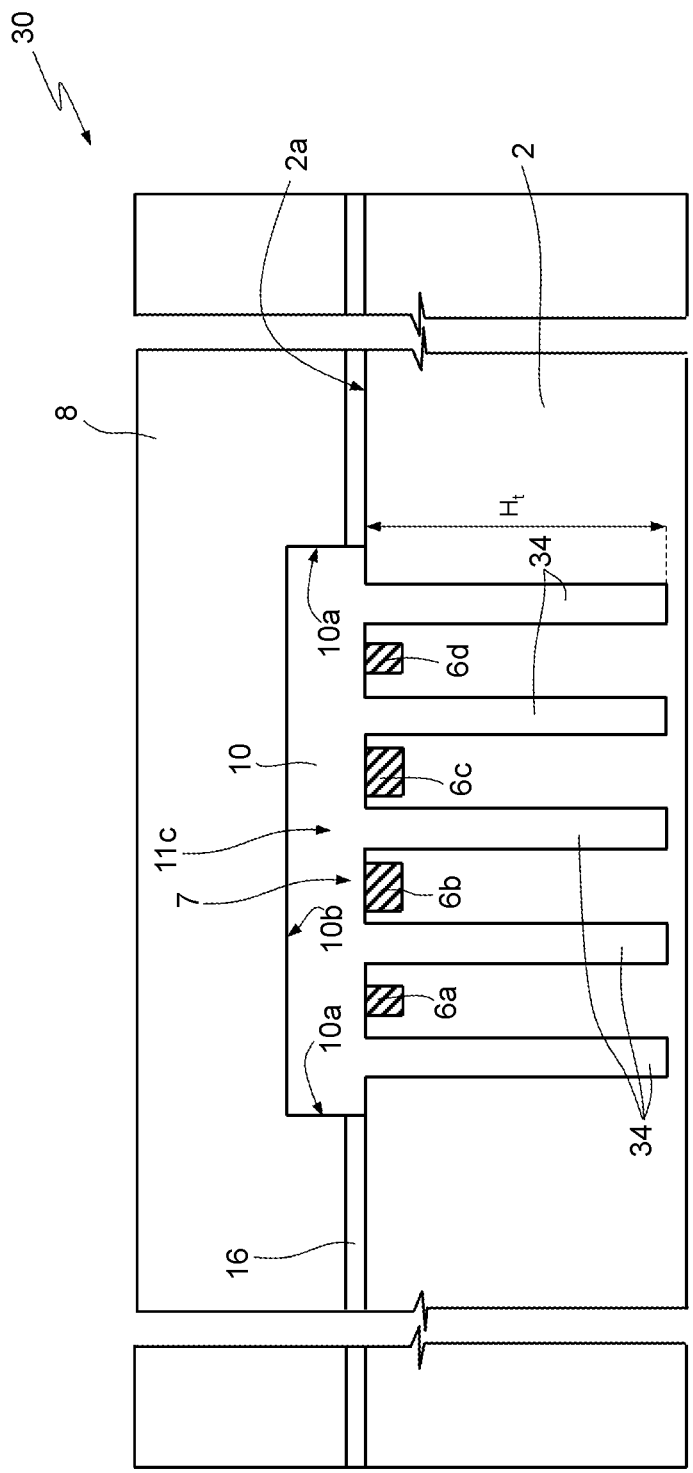
FIG. 5 is a cross-section view of a microelectromechanical transducer according to a further embodiment of the present disclosure.

FIG. 5 shows a pressure sensor 30 according to a further embodiment of the present disclosure. Differently from the pressure sensor 1 illustrated in FIG. 1, the substrate 12 is not present. Furthermore, the trenches 34 extend in the sensor body 2 at a depth $H_t$, measured along the z-axis, lower than the thickness of the sensor body 2. In other words, the trenches 34 end within the sensor body 2, at a distance from the rear surface 2b. Exemplary values of the depth $H_t$ of the trenches 24 range from 5 to 100 µm. A sealed cavity 11c is formed, which includes the recess 10 and the trenches 34. All other elements are in common to the pressure sensor 1 of FIG. 1 and designated by the same reference numbers, thus they are not described any further.

The arrangement of the piezoresistors 6a-6d and the trenches 34, forming the active area 7, is analogous to what already described for the piezoresistors 6a-6d and the trenches 4 of the pressure sensor 1 of FIGS. 1, 2.

The pressure sensor 30 has a lower thickness and lower manufacturing cost than the pressure sensors 1 and 20.

According to a further embodiment, not shown in the Figures, the recess 10 of the cap 8 of the pressure sensor 30 may not be present, analogously to what described above with reference to FIG. 4.

Figure 6:
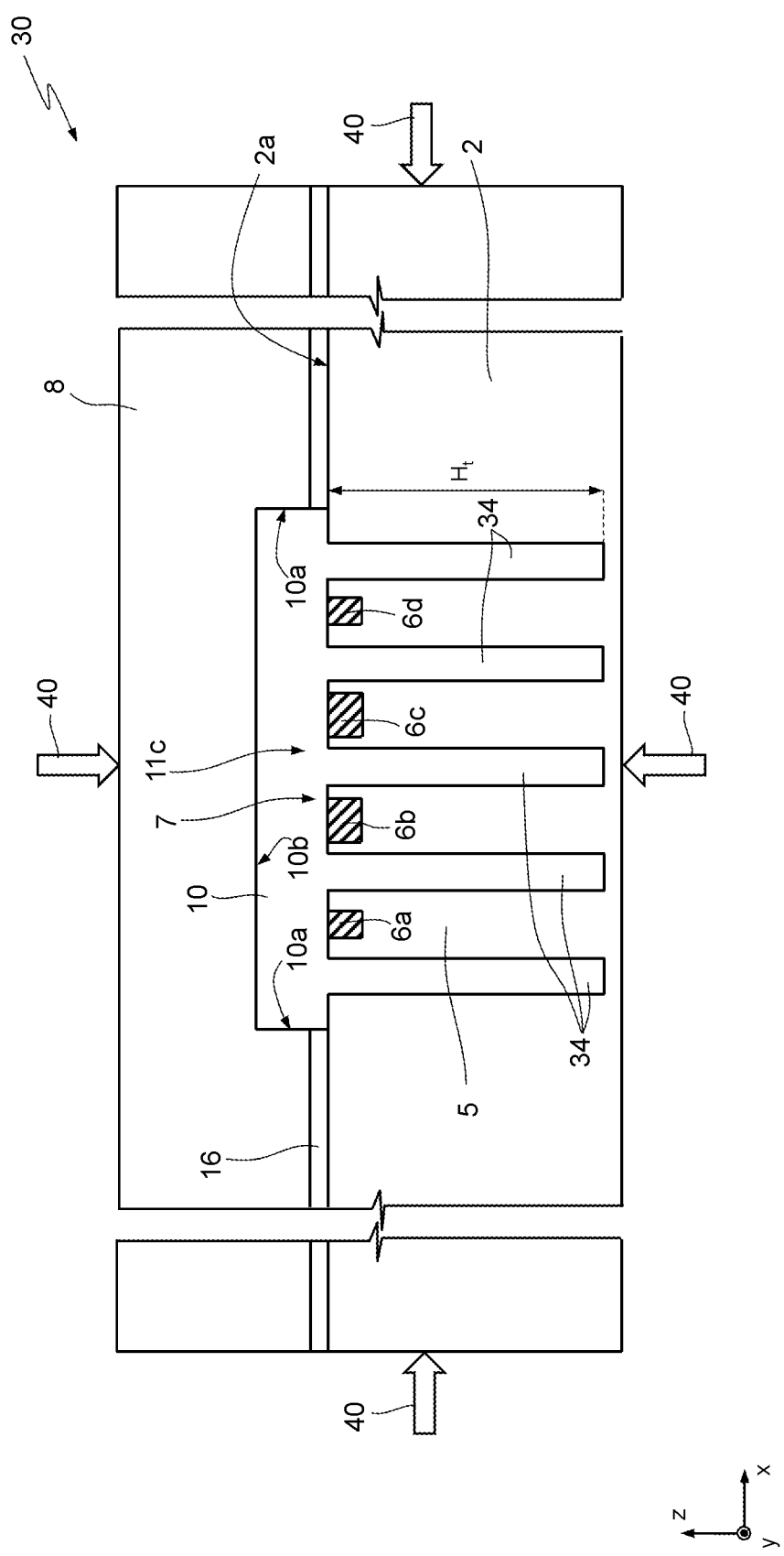
FIG. 6 is a cross-section view of the microelectromechanical transducer of FIG. 5 during use as a pressure sensor.
Figure 7:
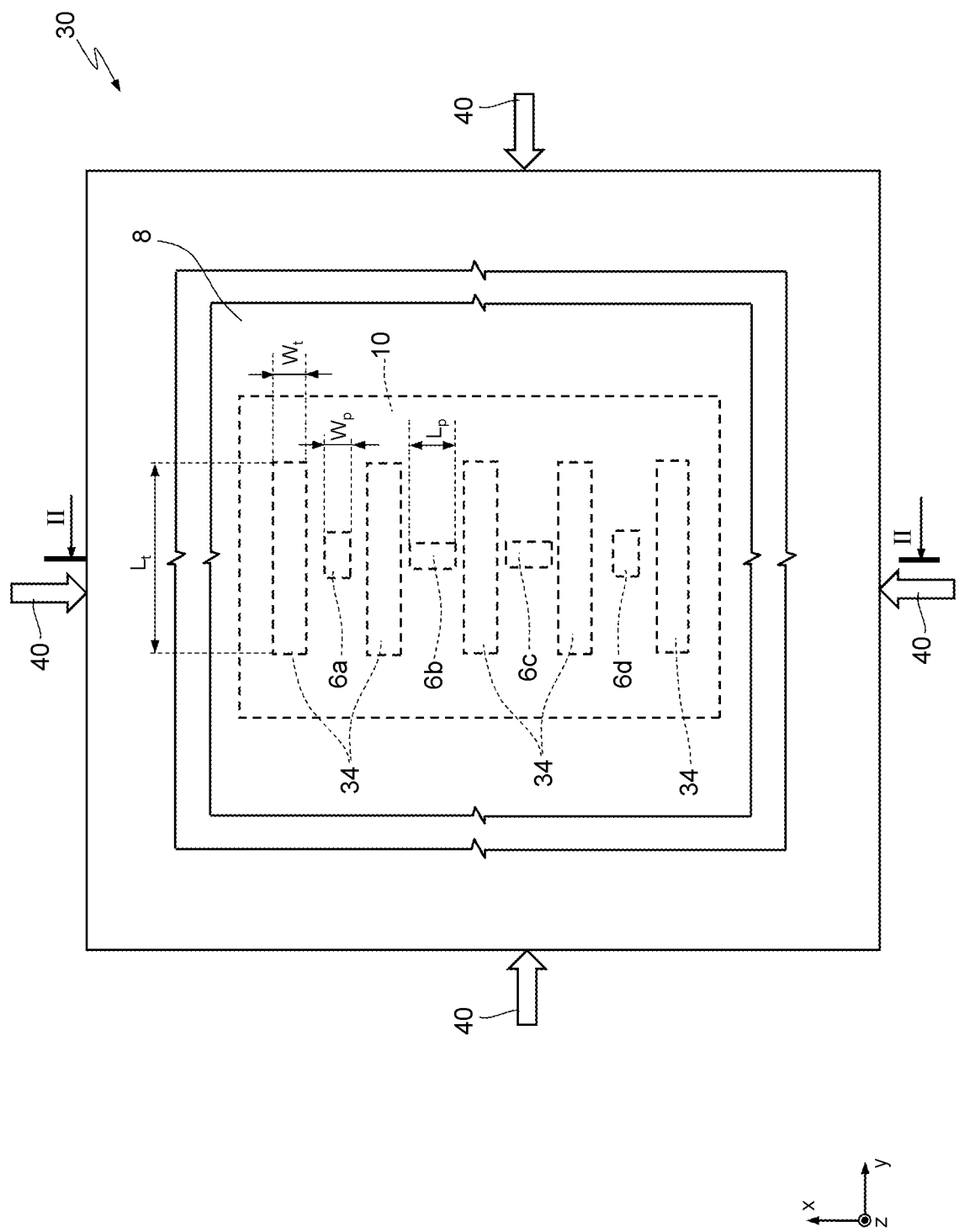
FIG. 7 is a top view of the microelectromechanical transducer of FIG. 6.

FIGS. 6 and 7 illustrate the working principle of the pressure sensors 1, 20, 30. More in particular, FIGS. 6 and 7 show the pressure sensor 30, in cross-section view and top view respectively, when subject to a hydrostatic pressure (represented by arrows 40). The cross-section view is taken along the line II-II. The hydrostatic pressure may be applied to all the outer surfaces of the pressure sensor 30. The pressure, which is the physical quantity to be measured, induces a planar mechanical stress σ at the surface 2a of the sensor body 2. This planar stress σ is concentrated between pairs of adjacent trenches 34, in the bridge structures 5 where the piezoresistors 6a-6d are located. When subject to the planar stress σ, the i-th piezoresistor 6a; ... ; 6d change its resistance value $R_i$ according to the known equation (1) of piezo-resistivity effect of silicon:

$$\frac{\Delta R_i}{R_i} = \frac{\Delta \rho_i}{\rho_i} = \pi_l \sigma_{li} + \pi_t \sigma_{ti} + \pi_z \sigma_{zi} \tag{1}$$

where $\rho_i$ is the resistivity of the i-th piezoresistor 6a; ... ; 6d; $\pi_l$, $\pi_t$ and $\pi_z$ are respectively the longitudinal (parallel to the length $L_p$), transversal (parallel to the width $L_p$) and normal components of the piezoresistive coefficient matrix with respect to the i-th piezoresistor 6a; ... ; 6d; $\sigma_{li}$, $\sigma_{ti}$ and $\sigma_{zi}$ are respectively the longitudinal, transversal and normal components of the stress with respect to the i-th piezoresistor 6a; ... ; 6d. More in particular, since the piezoresistors are subject to a planar stress σ at the surface 2a of the sensor body 2, where the piezoresistors 6a-6d lie, the normal component $\sigma_{zi}$ becomes zero. As an example, in the case of p-type silicon on crystalline plane (001) and crystalline direction <110>, equation (1) is simplified as:

$$\frac{\Delta R_i}{R_i} = \frac{\Delta \rho_i}{\rho_i} = \pi_{in\text{-}plane}(\sigma_{li} - \sigma_{ti}) \tag{1a}$$

$\pi_{in\_plane}$ is about one half of the silicon piezoresistive coefficient $\pi_{44}$ ($\pi_{in\_plane} \approx 70 \times 10^{-11}$ Pa$^{-1}$).

It can be noted that, in case of hydrostatic pressure, all resistors will experience negative stresses which lead to negative output for longitudinal resistors and positive outputs for transversal ones.

The arrangement of the trenches 34 affects the value of the components of the planar stress σ concentrated on the bridge structures 5 between pairs of adjacent trenches 34. In particular, the component of the planar stress σ parallel to the pair of trenches 34 is maximized, while the component of the planar stress σ perpendicular to the pair of trenches 34 is minimized. Thus, for the piezoresistors 6a and 6d, parallel to the trenches 34, $\sigma_{Li}$ is much higher in module than $\sigma_{Ti}$, whereas for the piezoresistors 6b and 6c, perpendicular to the trenches 34, $\sigma_{Ti}$ is much higher in module than $\sigma_{Li}$. As a consequence, when the pressure sensor 30 is subject to external pressure, considering that compressive stress has a negative sign, the resistance values $R_a$, $R_d$ of the piezoresistors 6a, 6d decrease, while the resistance values $R_b$, $R_c$ of the piezoresistors 6b, 6c increase.

This change of resistance values results in a change of the output voltage $V_o$ of the Wheatstone bridge biased by the input voltage $V_i$ as shown in FIG. 3, according to the known equation (2):

$$\frac{V_o}{V_i} = \frac{2\Delta R_{a,d} - 2\Delta R_{b,c}}{4R + 2(2\Delta R_{a,d} + 2\Delta R_{b,c})} = \frac{\Delta R_{a,d} - \Delta R_{b,c}}{2R + 2(\Delta R_{a,d} + \Delta R_{b,c})} \tag{2}$$

In presence of the following condition:

$$\Delta R_a = \Delta R_d = -\Delta R_b = -\Delta R_c = \Delta R$$

$$R_a = R_b = R_c = R_d = R \tag{3}$$

Equation (2) is simplified to:

$$\frac{V_o}{V_i} = \Delta R/R \quad (4)$$

In conclusion, the output voltage VO is correlated to the input pressure.

The pressure sensors 1, 20, 30 can be used as well for applications in which a force or a pressure is applied mostly or exclusively along the direction perpendicular to the plane on which the piezoresistors 6a-6d lie (i.e., the force or the pressure is applied along the z-axis).

In case of mono-axial vertical load, all the resistors of the Wheatstone bridge experience a positive stress, leading to positive output for longitudinal resistors and negative output for transversal ones.

Due to the fact that the cap 8 is anchored to the sensor body 2 through the first coupling region 16, the relative expansion of the cap 8 and sensor body caused by the applied force or pressure induces a planar stress distribution (e.g., tensile stress) at the surface 2a of the sensor body 2, and therefore on the piezoresistors 6a-6d. The same principle applies to the substrate 12 for the embodiments that include it.

According to an aspect of the present disclosure, to improve the mechanical coupling between the cap 8 to the sensor body 2, the angle α between the lateral walls 10a and the bottom wall 10b of the recess 10 in the cap 8 should be greater than or equal to 90°. Analogously, also the angle α between the lateral walls 14a and the bottom wall 14b of the recess 14 in the substrate 12 should be greater than or equal to 90°.

Figure 8:
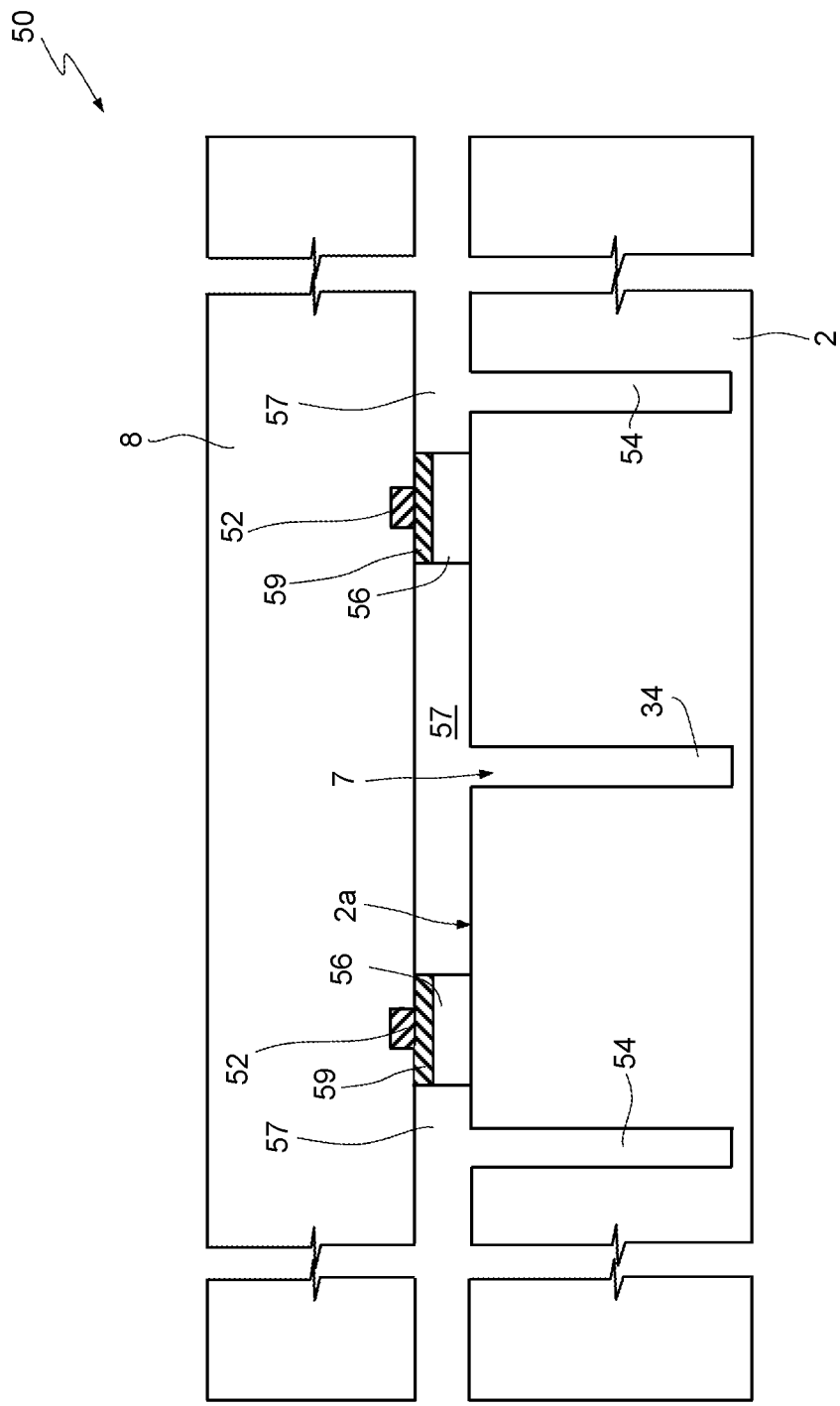
FIG. 8 is a cross-section view of a microelectromechanical transducer according to a further embodiment of the present disclosure, taken along the cut-line VIII-VIII of FIG. 9.
Figure 9:
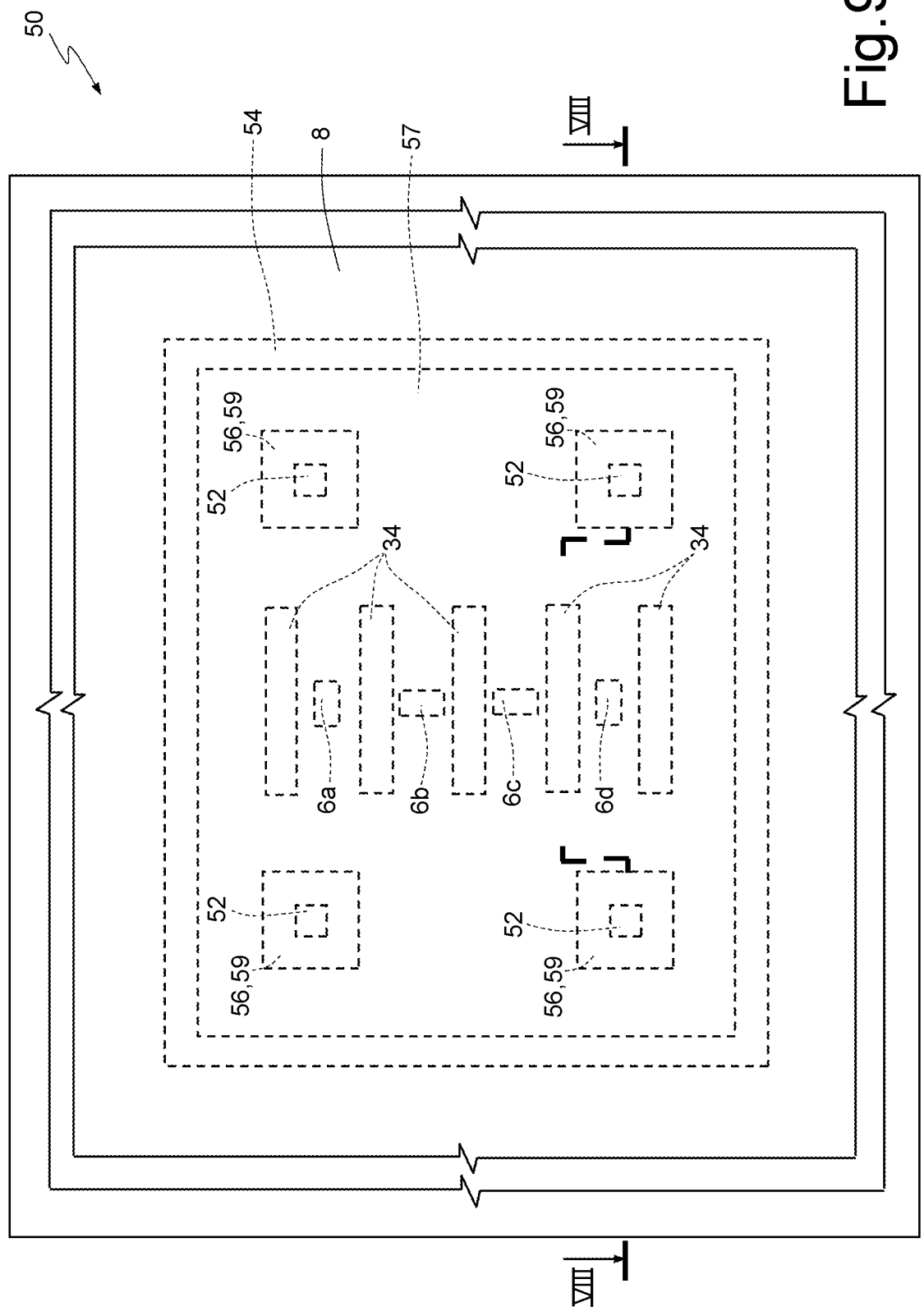
FIG. 9 is a top view of the microelectromechanical transducer of FIG. 8.

FIGS. 8 and 9 show a force sensor 50 according to a further embodiment of the present disclosure. FIG. 8 is a cross-section view of the force sensor 50, taken along the line VIII-VIII shown in FIG. 9. In this embodiment, the cap 8 is made of a flexible insulating material in which it is possible to form conductive paths 52. Conductive paths may alternatively be formed over the flexible insulating material. For example, the cap 8 may be a flexible printed circuit board, made for instance of a copper-coated polyimide layer (also known as "Kapton") or a thin flexible printed circuit board. The conductive paths 52 may define electrical connections to other components of the force sensor 50. For instance, the conductive paths 52 may be used to couple the piezoresistors 6a-6d in a Wheatstone bridge configuration. Analogously to the pressure sensor 30 of FIG. 5, the pressure sensor 50 does not include the substrate 12, and the trenches 34 end within the sensor body 2. The arrangement of the piezoresistors 6a-6d and the trenches 34, forming the active area 7, is analogous to what already described for the pressure sensor 30.

The force sensor 50 may optionally include a groove 54, surrounding the active region 7 to minimize the geometrical boundary effects of the sensor body 2 and thus increasing the efficiency of the sensor. A plurality of conductive pads 56 extend at the surface 2a of the sensor body 2, at a distance from the active region 7. The conductive pads 56 form electrical contact terminals for the piezoresistors 6a-6d connected in the Wheatstone bridge configuration. The conductive pads 56 may be of any suitable material, such as for instance aluminum.

The cap 8 is kept in suspended position above the active region 7 through suspension blocks 59, which may be in contact with the conductive pads 56. In this case, the suspension blocks 59 are of a conductive material, such as lead free electronic soldering, and electrically couple the conductive pads 56 to the conductive paths 52, so that the conductive pads 56 can be electrically accessed from the outside of the cavity 57.

The force sensor 50 is particularly suited for its use as a pushbutton force sensor (e.g., within 3D touch screens), because it has a very thin overall thickness and a high sensitivity. A force applied on the cap 8 is transferred to the substrate 2 through the suspension blocks 59 and the conductive pads 56, thus generating a stress having an in-plane component at the active region 7, which can be sensed through the piezoresistors in the active region 7.

Figure 10:
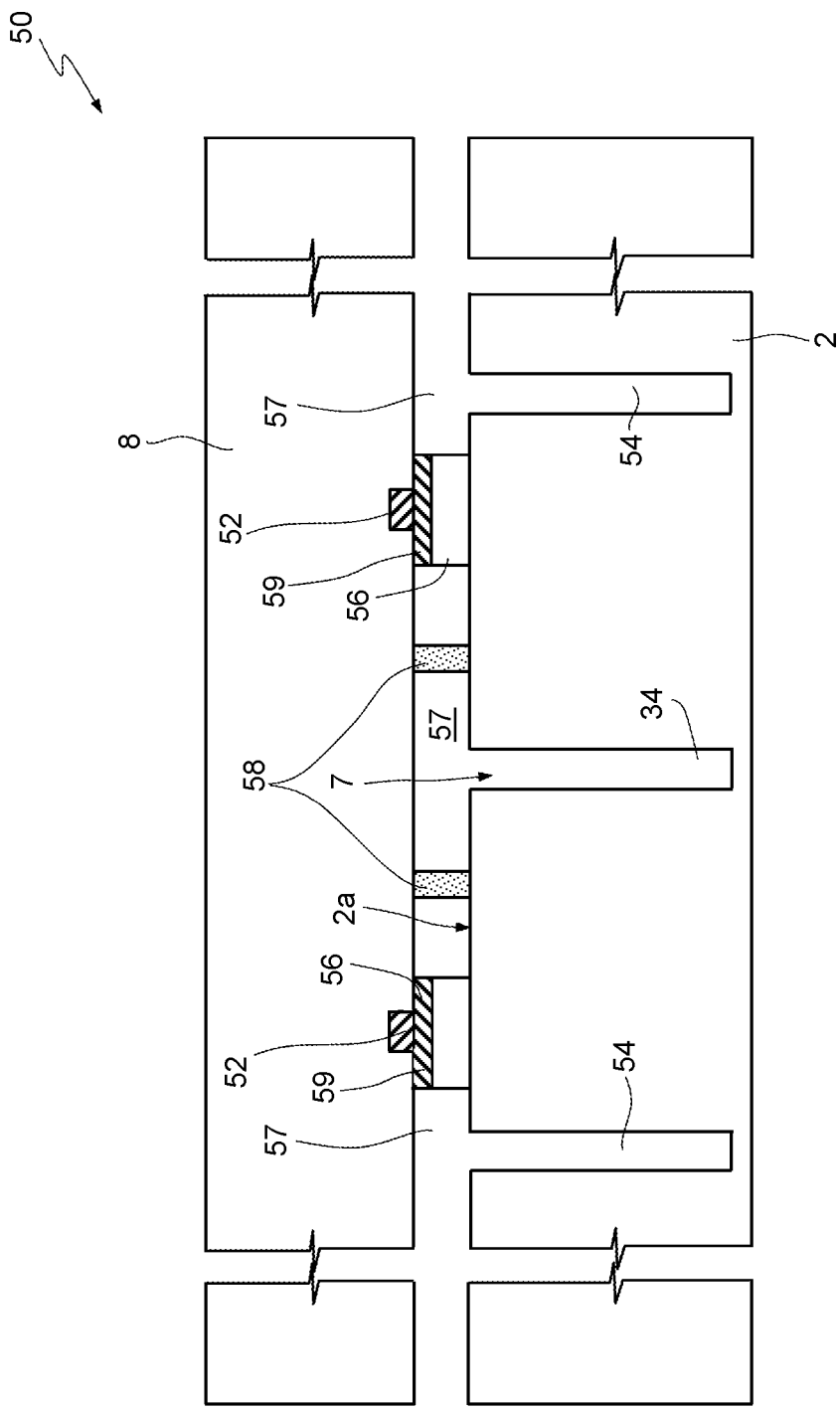
FIG. 10 is a cross-section view of a microelectromechanical transducer according to a further embodiment of the present disclosure, taken along the cut-line X-X of FIG. 11.
Figure 11:
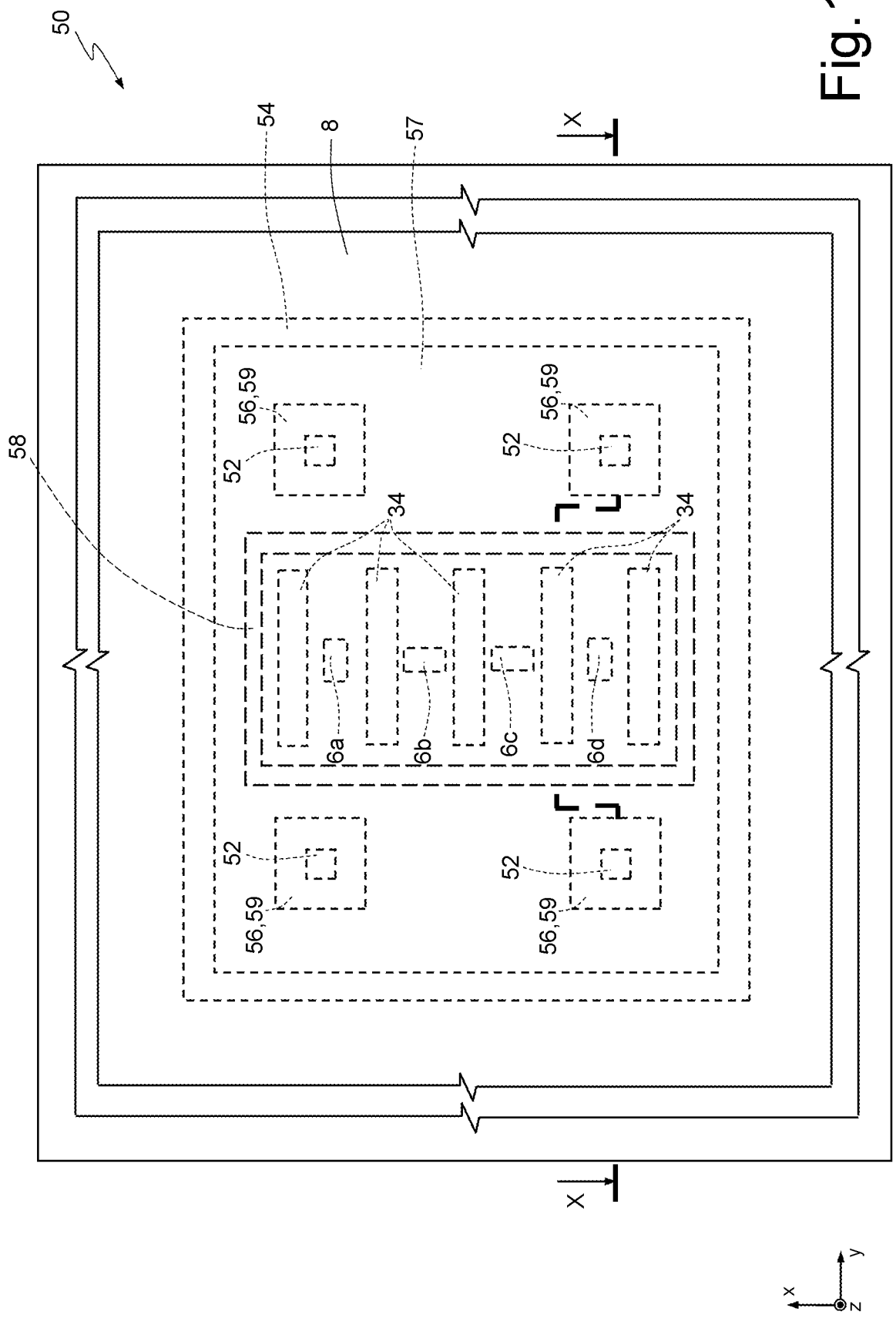
FIG. 11 is a top view of the microelectromechanical transducer of FIG. 10.
Figure 13:
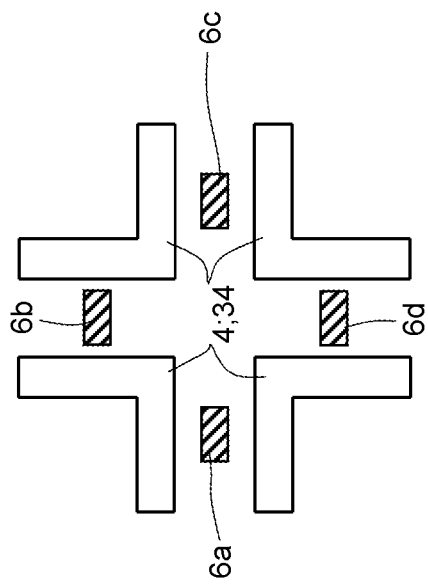
FIGS. 12-15 show, in a top view, respective layouts of a sensor element of the microelectromechanical transducer of FIGS. 1, 4, 5 and 8.

According to a further embodiment, shown in FIGS. 10 and 11, the cap 8 is further coupled to the front surface 2a of the sensor body 2 through a coupling region 58. It is noted that the embodiment of FIGS. 10 and 11 includes all the features already described for the embodiment of FIGS. 8 and 9 (identified using the same reference numbers) and further includes the coupling region 58.

The coupling region 58 completely surrounds the active region 7 in such a way that, when the cap 8 is coupled to the coupling region 58, a sealed cavity 57 is formed. The active area 7 is completely housed in the sealed cavity 57 thus formed. The coupling region 58 extends between the conductive pads 56 and the active region 7 (the conductive pads 56 are external to the cavity 57). In this way, the active region 7 is not exposed to the environment. The coupling region 58 may be of any suitable material, such as metallic bonding alloys or soft solders.

FIGS. 12-15 show alternative spatial arrangements of the trenches 4 and the piezoresistors 6a-6d for the pressure sensors 1, 20, or of the trenches 34 and the piezoresistors 6a-6d for the pressure sensors 30, 50. Alternative configurations may be designed according to the needs, e.g., taking into account the direction of applied force or pressure and/or space constraints.

Figure 15:
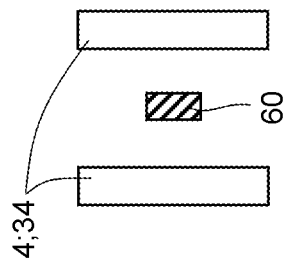
Figure 12:
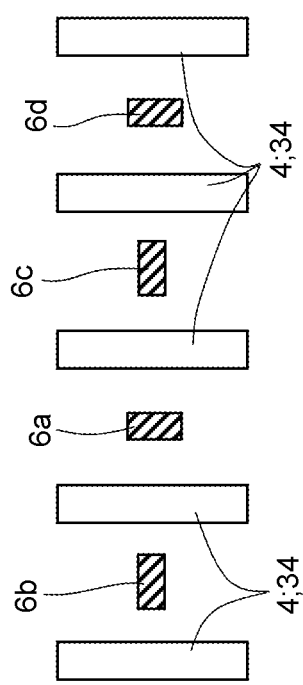
Figure 14:
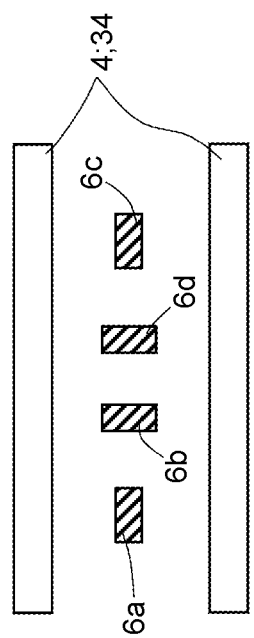

In further embodiments of the present disclosure, as shown in FIG. 15, a single piezoresistor 60 is integrated in the sensor body 2. During use, the piezoresistor 60 undergoes the same deformation as piezoresistors 6a-6d, and its change in resistance can be correlated, in a per se known way, to an amount of a force/pressure applied to the pressure sensor integrating the piezoresistor 60.

The microelectromechanical transducer disclosed according to the present disclosure may be used, for example, to measure pressures in harsh environments, such as in fuel injection systems, braking systems, pressure vessels.

Furthermore, the microelectromechanical transducer disclosed according to the present disclosure may be used as touch sensor in electronic devices.

The advantages of the disclosure described previously, according to the various embodiments, emerge clearly from the foregoing description.

In particular, all the embodiments of the present disclosure include a cap 8 protecting an active region 7, enabling a reliable use of piezoresistive pressure/force sensors in harsh environments.

In the above disclosed embodiments, the cap transfers the applied load along the Z direction into a planar stress distribution in the active region of the sensor.

Finally, it is clear that modifications and variations may be made to what has been described and illustrated herein, without thereby departing from the scope of the present disclosure.

For instance, the cap 8, the sensor body 2 and the substrate 12 may be of any suitable size and shape.

Furthermore, the trenches may have different shapes than the rectangular, or substantially rectangular, shape discussed. For instance, the trenches may have a rounded shape, a generic polygonal shape, etc. In an embodiment, not shown, a single trench having circular shape may be present, completely surrounding one or more piezoresistors.

In all the embodiments of the present disclosure, piezoresistors may be replaced by any other element sensitive to changes of planar strain or stress, for example metallic strain gauges.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical transducer, comprising:
a semiconductor body having a first surface and a second surface opposite to one another;
a first structural body coupled to the first surface of the semiconductor body;
a sealed cavity extending between the semiconductor body and the first structural body and including at least two trenches in the semiconductor body, the at least two trenches defining a bridge structure in the semiconductor body, said trenches extending along a vertical direction from the first surface towards the second surface of the semiconductor body; and
a sensor element positioned on or in the bridge structure between the at least two trenches.

2. The microelectromechanical transducer according to claim 1, further comprising a coupling region between the semiconductor body and the first structural body, the coupling region laterally enveloping at least a portion of the sealed cavity and having a thickness such that the first structural body is spaced from the bridge structure along said vertical direction.

3. The microelectromechanical transducer according to claim 1, wherein the sealed cavity comprises a recess in the first structural body, the first recess facing the semiconductor body.

4. The microelectromechanical transducer according to claim 1, wherein the trenches extend from the first surface to the second surface through a whole thickness of the semiconductor body, the microelectromechanical transducer further comprising: a second structural body coupled to the second surface of the semiconductor body; wherein the sealed cavity extends between the semiconductor body and the second structural body.

5. The microelectromechanical transducer according to claim 4, further comprising:
a first coupling region between the semiconductor body and the first structural body, the first coupling region laterally enveloping a first portion of the sealed cavity and having a thickness such that the first structural body is spaced from the bridge structure along said vertical direction; and
a second coupling region between the semiconductor body and the second structural body, the second coupling region laterally enveloping a second portion of the sealed cavity and having a thickness such that the second structural body is spaced from the bridge structure along said vertical direction.

6. The microelectromechanical transducer according to claim 4, wherein:
the sealed cavity comprises a first recess in the first structural body, the first recess facing the semiconductor body; and
the sealed cavity comprises a second recess in the second structural body, the second recess facing the semiconductor body.

7. The microelectromechanical transducer according to claim 4, wherein the second structural body is of a material among: semiconductor, ceramic, and metal.

8. The microelectromechanical transducer according to claim 1, wherein the trenches are confined within the semiconductor body.

9. The microelectromechanical transducer according to claim 1, wherein the sensor element includes one among: a single piezoresistor; at least two piezoresistors; and four piezoresistors connected in a Wheatstone bridge.

10. e microelectromechanical transducer according to claim 1, wherein:
the trenches have, on a plane orthogonal to the vertical direction, a respective longitudinal extension and a respective transverse extension which is orthogonal to the longitudinal extension, and
the sensor element includes one among: a single piezoresistor having, on said plane, a main extension parallel to said longitudinal extensions; at least two piezoresistors having, on said plane, a respective main extension parallel to the longitudinal extensions and, respectively, to the transverse extensions; four piezoresistors connected in a Wheatstone bridge, two of which have, on said plane, a main extension parallel to the longitudinal extensions and the other two having, on said plane, a main extension parallel to the transverse extensions.

11. The microelectromechanical transducer according to claim 1, wherein the sealed cavity comprises a first recess in the first structural body, the first recess facing the semiconductor body and having a height, measured from first surface along said vertical direction, in a range 1-500 µm.

12. The microelectromechanical transducer according to claim 1, further comprising:
a coupling region between the semiconductor body and the first structural body, the coupling region laterally enveloping at least a portion of the sealed cavity and having a thickness such that the first structural body is spaced from the bridge structure along said vertical direction;
a plurality of conductive pads extending on the first surface of the semiconductor body external to the coupling region and the sealed cavity; and
a plurality of suspension blocks mechanically and electrically coupled to the conductive pads, respectively, and to the first structural body.

13. The microelectromechanical transducer according to claim 12, wherein the conductive pads are electrically coupled to electrical terminals of the sensor element.

14. The microelectromechanical transducer according to claim 12, wherein the semiconductor body includes a groove extending along a vertical direction from the first surface towards the second surface of the semiconductor body, the groove surrounding the trenches and bridge structure.

15. A microelectromechanical transducer, comprising:
a semiconductor body, having a first surface and a second surface opposite to one another, the semiconductor body including at least two recesses that define a bridge structure in the semiconductor body, said recesses extending along a vertical direction from the first surface towards the second surface of the semiconductor body;

a structural body coupled to the first surface of the semiconductor body, with a sealed space formed between the structural body and the semiconductor body, the sealed space including the recesses;

a sensor element positioned on or in the bridge structure between the recesses.

16. The microelectromechanical transducer according to claim 15, further comprising:

a plurality of conductive pads extending on the first surface of the semiconductor body external to the recesses; and a plurality of suspension blocks positioned between the conductive pads, respectively, and the structural body.

17. The microelectromechanical transducer according to claim 16, wherein the conductive pads are electrically coupled to electrical terminals of the sensor element.

18. The microelectromechanical transducer according to claim 15, wherein the semiconductor body includes a groove extending along a vertical direction from the first surface towards the second surface of the semiconductor body, the groove laterally enveloping the recesses.

19. A method for manufacturing a microelectromechanical transducer, comprising:

forming in a semiconductor body at least two trenches that define a bridge structure of the semiconductor body, the semiconductor body having first and second surfaces opposite to one another, said trenches extending along a vertical direction from the first surface towards the second surface of the semiconductor body;

forming a sensor element in or on the bridge structure;

coupling a structural body to the first surface of the semiconductor body, the coupling including forming a sealed cavity that is partially between the semiconductor body and the structural body and includes the trenches.

20. The method according to claim 19, further comprising forming a recess in the structural body prior to coupling the structural body to the semiconductor body, the recess forming part of the sealed cavity.

* * * * *

UNITED STATES PATENT AND TRADEMARK OFFICE
CERTIFICATE OF CORRECTION

PATENT NO. : 10,737,929 B2
APPLICATION NO. : 15/962952
DATED : August 11, 2020
INVENTOR(S) : Mohammad Abbasi Gavarti et al.

Page 1 of 1

It is certified that error appears in the above-identified patent and that said Letters Patent is hereby corrected as shown below:

In the Claims

<u>Column 10, Line 21, Claim 10:</u>
"e microelectromechanical" should read, --The microelectromechanical--.

Signed and Sealed this
Fifteenth Day of September, 2020

Andrei Iancu
*Director of the United States Patent and Trademark Office*